United States Patent
Schall et al.

(10) Patent No.: US 10,727,843 B2
(45) Date of Patent: Jul. 28, 2020

(54) METHOD FOR OPERATING A WIND TURBINE

(71) Applicants: Nordex Energy GmbH, Hamburg (DE); Woodward Kempen GmbH, Kempen (DE)

(72) Inventors: Nils-Hendric Schall, Berlin (DE); Andreas Genius, Muelheim an der Ruhr (DE); Nils Hoffmann, Halle/Saale (DE)

(73) Assignees: Nordex Energy GmbH, Hamburg (DE); Woodward Kempen GmbH, Kempen (DE)

( * ) Notice: Subject to any disclaimer, the term of this patent is extended or adjusted under 35 U.S.C. 154(b) by 0 days.

(21) Appl. No.: 16/251,200

(22) Filed: Jan. 18, 2019

(65) Prior Publication Data

US 2019/0229735 A1    Jul. 25, 2019

(30) Foreign Application Priority Data

Jan. 19, 2018  (EP) .................................. 18152603

(51) Int. Cl.
| | |
|---|---|
| *H03L 7/093* | (2006.01) |
| *F03D 9/00* | (2016.01) |
| *H02P 9/00* | (2006.01) |
| *H02P 9/02* | (2006.01) |
| *H02J 3/38* | (2006.01) |

(52) U.S. Cl.
CPC ................ *H03L 7/093* (2013.01); *F03D 9/00* (2013.01); *H02J 3/386* (2013.01); *H02P 9/007* (2013.01); *H02P 9/02* (2013.01)

(58) Field of Classification Search
CPC .. H03L 7/093; F03D 9/00; H02J 3/386; H02P 9/007; H02P 9/02
See application file for complete search history.

(56) References Cited

U.S. PATENT DOCUMENTS

| | | | |
|---|---|---|---|
| 6,850,426 B2 * | 2/2005 | Kojori | H02P 23/0004 363/123 |
| 6,941,113 B2 | 9/2005 | Asano | |
| 9,461,572 B2 * | 10/2016 | Wessels | H02J 3/1885 |
| 2005/0122083 A1 | 6/2005 | Edrman et al. | |
| 2008/0093853 A1 * | 4/2008 | Barker | H02J 3/386 290/44 |
| 2009/0250931 A1 * | 10/2009 | Schubert | H02J 3/386 290/44 |
| 2010/0124498 A1 * | 5/2010 | Kabatzke | F03D 7/047 416/61 |

(Continued)

FOREIGN PATENT DOCUMENTS

EP              1914877 A2      4/2008

*Primary Examiner* — Tulsidas C Patel
*Assistant Examiner* — Joseph Ortega
(74) *Attorney, Agent, or Firm* — Barclay Damon LLP

(57) ABSTRACT

A method for operating a wind turbine configured to supply electrical power to an electrical power supply network via a converter comprises measuring a phase angle and measuring a voltage of the electrical power supply network. A value of at least one parameter for a phase locked loop is determined depending on the measured voltage. The phase locked loop is used to determine a corrected phase angle depending on the measured phase angle and the voltage of the electrical power supply network. The corrected phase angle is input into the converter.

16 Claims, 5 Drawing Sheets

(56) References Cited

U.S. PATENT DOCUMENTS

| | | | | |
|---|---|---|---|---|
| 2012/0310426 | A1* | 12/2012 | Tarnowski | F03D 7/0272 |
| | | | | 700/287 |
| 2014/0145508 | A1* | 5/2014 | Wagoner | H02J 3/28 |
| | | | | 307/72 |
| 2014/0265596 | A1* | 9/2014 | Yuan | H02J 3/382 |
| | | | | 307/69 |
| 2014/0312882 | A1* | 10/2014 | Dong | H03L 7/08 |
| | | | | 324/76.53 |
| 2015/0249412 | A1* | 9/2015 | Larsen | H02M 5/4585 |
| | | | | 290/44 |
| 2015/0249416 | A1* | 9/2015 | Barker | H02H 7/067 |
| | | | | 290/44 |
| 2015/0263508 | A1* | 9/2015 | Zhu | H02H 7/06 |
| | | | | 290/44 |
| 2015/0311696 | A1* | 10/2015 | Zhu | H02H 3/207 |
| | | | | 361/21 |
| 2018/0031617 | A1* | 2/2018 | Rieken | G01D 4/004 |
| 2018/0112647 | A1* | 4/2018 | Abeyasekera | H02H 7/26 |
| 2018/0142660 | A1* | 5/2018 | Forster | F02N 11/04 |
| 2018/0278060 | A1* | 9/2018 | Sun | H02J 3/08 |
| 2018/0328342 | A1* | 11/2018 | Ren | F03D 7/0272 |
| 2018/0348712 | A1* | 12/2018 | Zhong | G01R 15/142 |
| 2019/0024634 | A1* | 1/2019 | Tarnowski | G05B 15/02 |
| 2019/0123662 | A1* | 4/2019 | Zhang | H02J 3/18 |
| 2019/0190274 | A1* | 6/2019 | Fazeli | H02J 3/381 |
| 2019/0360470 | A1* | 11/2019 | Lund | F03D 17/00 |

* cited by examiner

METHOD FOR OPERATING A WIND TURBINE

CROSS REFERENCE TO RELATED INVENTION

This application is based upon and claims priority to, under relevant sections of 35 U.S.C. § 119, European Patent Application No. 18 152 603.9, filed Jan. 19, 2018, the entire contents of which are hereby incorporated by reference.

BACKGROUND

The present invention relates to a method for operating a wind turbine, which supplies, synchronized with a network voltage, electrical power to an electrical power supply network via a converter.

In general, the invention relates to the field for the control of a converter system of a wind turbine, in particular the control of a partial converter for a double-fed asynchronous generator. For operating the wind turbine, the control of the converter in the event of a network failure presents a special technical challenge.

A method and a device for operating an electrical machine are known from EP 1 914 877 A2. The electrical machine, which may be a wind turbine, is designed to be connected electrically with the electrical power supply network. A controller is provided for the electrical machine so that it remains connected electrically with the power supply network during and after a voltage drop for an indeterminate period of time. In particular, it is known to provide a phase locked loop, which has a phase detector and at least one proportional integral (PI) filter, in the event of a drop in voltage to almost zero volts, zero voltage ride through (ZVRT). It is further provided that the parameters of the PI filter can be selected discretely depending on states defined depending on the network voltage, wherein a state machine can be accessed for this.

It is known from U.S. Pat. No. 6,941,113 B2 to control a wind turbine with a double-fed asynchronous generator via a phase locked loop. In the event of certain events in the network and/or in the wind turbine, it can happen that the phase locked loop is temporarily not synchronous with the network voltage. The phase locked loop in this case permits the wind turbine to ride through the event and only supply power again at a later point in time synchronously with the network voltage. So that the phase locked loop can be synchronized again quickly, a phase angle deviation is determined and a scaling factor is calculated from it when a minimum value is exceeded, which is applied to the setpoint values of the currents to be supplied.

The object of the invention is to provide a method for operating a wind turbine, which permits with simple means even in the case of transient voltage errors in the electrical power supply network a reliable and dynamic tracking of the phase angle and thereby avoids erratic behavior. Furthermore, a method should be specified that permits stable operation of the wind turbine over the entire voltage range.

BRIEF SUMMARY OF THE INVENTION

The method according to the invention is provided and determined for operating a wind turbine, which supplies, synchronized with a network voltage, electrical power to an electrical power supply network via a converter. For example, this can be a wind turbine equipped with a double-fed asynchronous machine, which supplies power via a partial converter. The method according to the invention accesses a phase angle measured in the electrical power supply network and a voltage measured in it. The supplying of electrical power set in its phase position for the network voltage and its phase takes place via a phase locked loop, at which the measured phase angle from the electrical power supply is present and which outputs a corrected phase angle for controlling the converter. In the method according to the invention, at least one parameter of the phase locked loop is determined depending on the measured amplitude value of the voltage in the electrical power supply. This makes it possible to determine the behavior of the phase locked loop in a voltage-dependent manner and to adjust the at least one parameter on the phase locked loop. In this manner, the behavior of the phase locked loop is set in a voltage-dependent manner and can thus be adjusted well for a voltage drop in the network without the phase locked loop changing its dynamics for regular operation. The invention enables a riding through of a deep network voltage error, wherein the wind turbine remains connected with the network and without thereby negatively impacting the control dynamics of the phase locked loop in the rated operation of the wind turbine. If for example high dynamics are desired in the case of the power supply of the wind turbine relative to network frequency oscillations for the rated operation of the wind turbine, then this does not collide with a large inertia of the phase locked loop in the case of a voltage drop, in particular not in the case of a voltage drop from zero volts or almost zero volts, zero voltage ride through (ZVRT).

In an embodiment, the at least one parameter, which is determined in a voltage-dependent manner, is selected such that it determines the dynamics of the phase locked loop. The voltage dependency is hereby selected such that, for example in the case of a low measured voltage, the dynamics of the phase locked loop is adjusted. It is hereby possible to adjust the dynamics of the phase locked loop in a voltage-dependent manner as needed. For example, both a highly dynamic operation of the phase locked loop in regular operation as well as operation with slowed dynamics in the event of a voltage drop are thereby possible.

In an embodiment, in the case of a measured voltage below a threshold value, the at least one parameter will assume a value with which the phase locked loop holds constant the last corrected phase angle. The phase locked loop freezes at a constant value which was present at the converter as the corrected phase angle before the voltage drop. The threshold value can thereby be preferably set or parameterized by selecting the function/characteristic curve.

In general, the phase locked loop can be structured in any manner for the present invention. It is particularly advantageous to provide a proportional loop filter with an amplification factor $K_P$. The value of the amplification factor $K_P$ is determined in a voltage-dependent manner. The dynamics of the phase locked loop can be determined in a voltage-dependent manner from the proportionality constant $K_P$ and/or the time constant $T_1$.

The phase-locked loop preferably has a feed-forward control of the network frequency, which has a low-pass filter with a time constant $T_1$, the value of which is determined in a voltage-dependent manner.

The time constant $T_1$ is increased to a very high value in the event of a network error so that the phase locked loop outputs an almost constant value for the corrected phase angle.

The amplification factor $K_P$ is reduced to a value of approximately zero in the event of a network error so that the phase locked loop outputs an almost constant value for the corrected phase angle.

One or several different criteria can be defined for the network error. A criterion for a particularly strong voltage drop is then present when the voltage drops to a value below a threshold value. This scenario also comprises a voltage drop to zero and to almost zero volts, in the case of which the network voltage fails.

The at least one parameter is preferably continuously dependent on the voltage. A value for the parameter is thus continuously assigned to each voltage value between a voltage value in the event of the network error and the nominal voltage or even beyond, wherein in the case of the network error a constant value is set for the corrected phase angle and in the case of the nominal voltage a predetermined dynamic is set for the phase locked loop. The at least one parameter preferably progresses continuously between a minimum and a maximum value, for example in the form of a saturation curve. In an embodiment, the value of the at least one parameter assumes its values proportionally, preferably approximately linearly between two turning points, depending on the voltage value.

BRIEF DESCRIPTION OF THE DRAWINGS

The invention is explained in greater detail below using an example. In the figures.

DETAILED DESCRIPTION OF THE INVENTION

Figure 1:
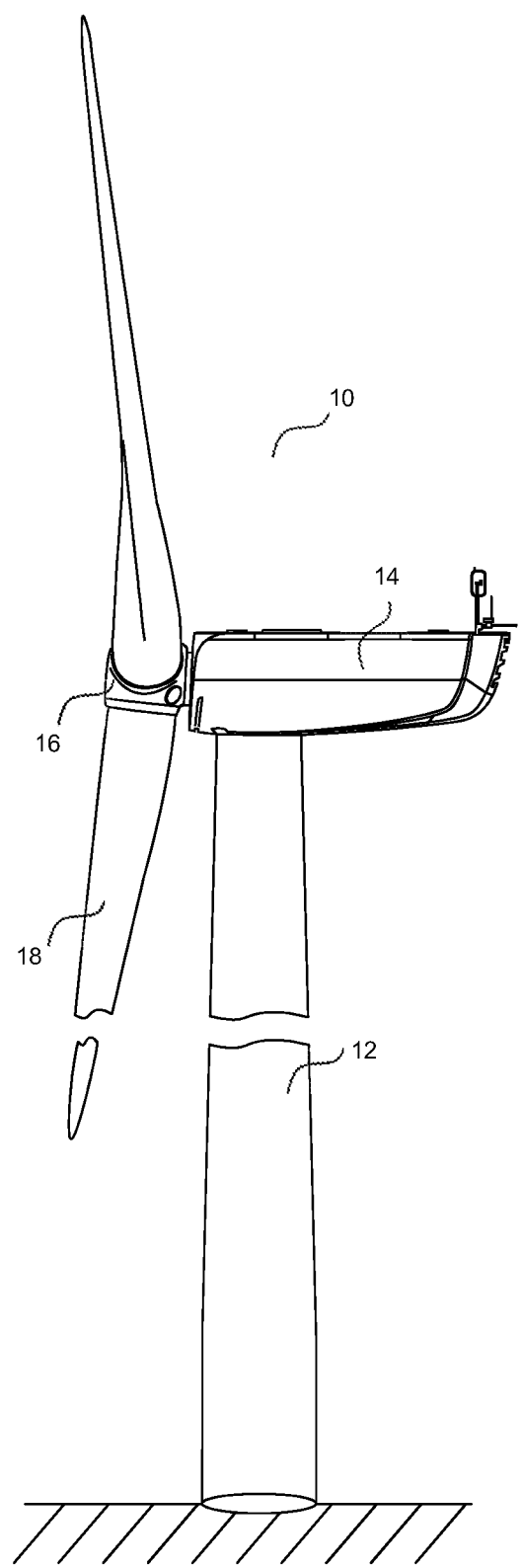
FIG. 1 illustrates a side view of an embodiment of a wind turbine.

FIG. 1 shows a wind turbine 10 with a tower 12 and a nacelle 14 arranged on it. The nacelle 14 supports a rotor 16 with its rotor blades 18.

Figure 2:
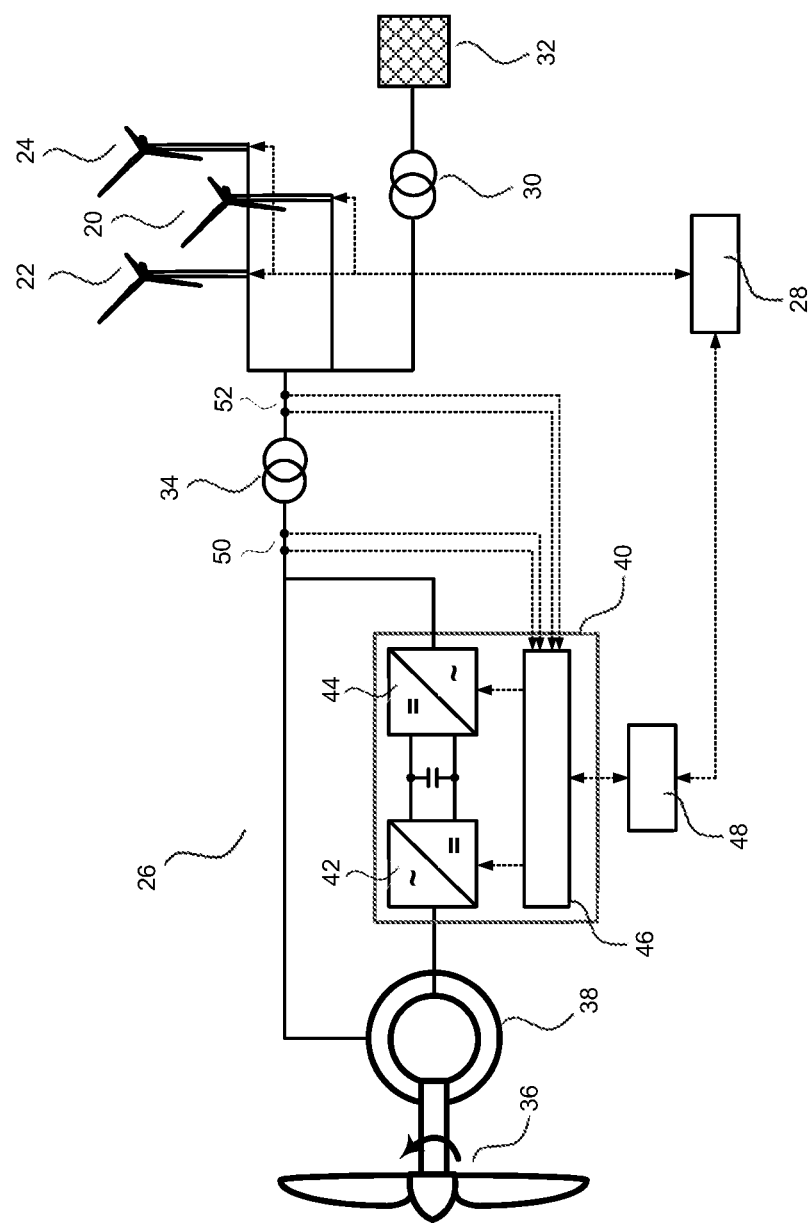
FIG. 2 illustrates a schematic view of an embodiment of an electrical structure of the wind turbine coupled with an electrical power supply network in a wind farm.

FIG. 2 shows a wind farm with a plurality of wind turbines 20, 22, 24, 26, which is controlled by a wind farm controller 28. The wind farm controller 28 is thereby configured for bidirectional data exchange with the wind turbines 20, 22, 24, 26, or respectively their controllers. The wind turbines 20, 22, 24, 26 supply power to a common wind farm network, which supplies an electrical power supply network 32 via a coupling point 30. The wind turbines 20, 22, 24, 26 each supply the wind farm network via a medium-voltage transformer 34, shown for example for the wind turbine 26.

The wind turbine 26 is shown as a double-fed asynchronous machine. The rotor 36 drives the rotor of a generator 38 via a drive train (not shown in detail). The rotor circuit of the generator 38 is connected with the transformer 34 and the electrical power supply network 32 via a converter system 40. The stator circuit of the generator 38 is connected directly with the transformer 34 and the electrical power supply network 32. The converter system 40 has a rotor-side converter 42 and a network-side converter 44, which are interconnected via a direct current link. The converters 42 and 44 are controlled by a converter controller 46.

The full wind turbine 26 is controlled via a wind turbine controller 48, which exchanges bidirectional data with the wind farm controller 28 for the control. A series of input variables are present at the converter controller 46. Measured values or values derived from the measured values can be present as input variables at the converter controller 46. The measured variables required for the control can either be measured by sensors 50 on the system side of the transformer 34 or by sensors 52 on the network side of the transformer 34. For example, the voltage and currents on the individual phases of the system are captured as measured variables. The processing of the measured values can take place by the sensors 50, 52 themselves or in the converter controller 46. The sensors 50, 52 are configured to provide suitable measured data or to provide data to the converter controller 46 for further processing. For synchronization with the electrical power supply network, at least one phase angle φline and one positive sequence voltage ULV+ (Positive Sequence Voltage) are present after the processing of the measured data in the converter controller 46 as input variables for the phase locked loop (PLL) described below. The input variables can be determined in the known manner from the measured variables.

Figure 3:
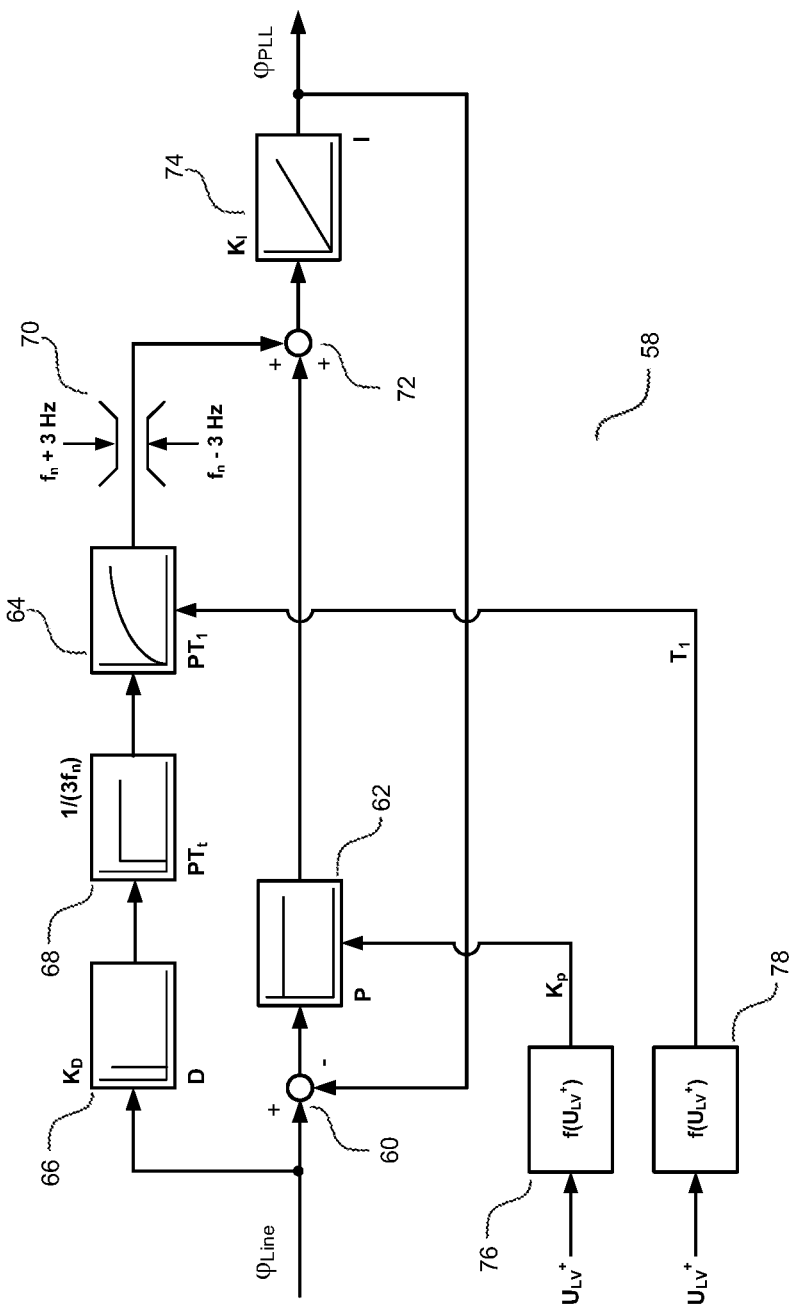
FIG. 3 illustrates a schematic view of an embodiment of a phase locked loop (PLL) for the continuous determination of the phase angle depending on the network voltage.

FIG. 3 shows an exemplary phase locked loop (PLL) 58, which is set up to continuously determine a corrected phase angle φPLL to be used for the control of the converter 40 (FIG. 2) depending on the existing positive sequence voltage $U_{LV}$+ and the measured phase angle $\varphi_{line}$. The phase locked loop 58 in the exemplary embodiment according to FIG. 3 is configured as part of the control software of the converter regulator 46 (FIG. 2).

The measured phase angle $\varphi_{line}$ and the corrected phase angle $\varphi_{PLL}$ are present at a subtraction element 60, which is set up to form a phase angle difference Δφ from the measured phase angle $\varphi_{line}$ and the corrected phase angle $\varphi_{PLL}$. The corrected phase angle $\varphi_{PLL}$ can be understood in the control-oriented sense as a setpoint value for the network-synchronous operation of the converter 40 (FIG. 2). The difference Δφ formed in the subtraction element 60 can be considered in a control-oriented sense as a control variable. The phase angle difference Δφ is present at a proportional element (P element) 62 and is amplified in a voltage-dependent manner with a factor $K_P$. The corresponding amplification factor $K_P$ is specified in a voltage-dependent manner by a calculation block 76 and is present as an input variable at the P element 62.

The measured phase angle $\varphi_{Line}$ is present in a parallel branch at a derivative element (D element) 66, which is set up to determine the network angular frequency ω from the measured phase angle $\varphi_{Line}$. The network angular frequency is present as an input signal at a dead-time element (PTt element) 68, which is set up to provide the network frequency delayed for the calculation of the phase angle. The delay of the dead-time element can be optionally adjusted. The delay can preferably be specified such that, in the event of a network error, it is not a network frequency disturbed by the error but rather the network frequency before the occurrence of the error that is used for determining the phase angle. In the specified exemplary embodiment, the dead-time element continuously delays the network frequency used to calculate the phase angle by the time corresponding to three network periods. The output signal of the PTt element 68 is present at a delay element ($PT_1$ element) 64. The $PT_1$ element 64 has a proportional transmission behavior together with a first order delay. The corresponding parameter $T_1$ for the delay is specified in a voltage-dependent manner by a calculation block 78 and is present as an input variable at the $PT_1$ element 64. The output of the $PT_1$ element 64 is present at an optional, adjustable frequency limiter 70, which limits positive and negative frequency deviations.

The output of the parallel branch with the members 64, 66, 68 and 70 is present together with the output of the P element 62 at a summation element 72. The sum of the amplified measured phase angle and the filtered network angular frequency is integrated into the corrected phase angle $\varphi_{PLL}$ via an integration element (I element) 74. An integration constant KI is specified for this in the I element. The phase angle $\varphi_{PLL}$ is provided to control the switching elements of the converter 40 (FIG. 2).

The calculation blocks 76 and 78 of the PLL 58 shown in FIG. 3 are configured to determine the PLL parameters $K_P$ and $T_1$ depending on the positive sequence voltage $U_{LV}+$, which is present as an input variable at the two calculation blocks 76, 78. In order to determine the PLL parameters, functions or respectively characteristic curves are to be specified in the calculation blocks 76, 78 depending on the positive sequence voltage $U_{LV}+$. The two functions or respectively characteristic curves are shown symbolically in FIG. 3 by the curves $f(U_{LV}+)$. The characteristic curves are specified as functions depending on the network voltage. Alternatively, the characteristic curves can also be specified in the form of a look-up table, which specifies the characteristic curve's progression through a plurality of value pairs of the network voltage and of the respective PLL parameter. It can be provided for the functions $f(U_{LV}+)$ as a linear function or a non-linear function. The explanation for FIG. 4 covers this in greater detail.

The functions f are substantially constant values for the control parameters $K_P$ and $T_1$ are present in an upper range around values for the positive sequence voltage of 100%, with respect to the nominal value of the positive sequence voltage $U_{LV}+$. The upper range is defined for example by values of 90% to 115% of the nominal value of the positive sequence voltage. The upper limit of this range can correspond for example to a maximum value for the positive sequence voltage, in the case of which the wind turbine can still be operated at least temporarily in the event of a network voltage failure. The functions are further preferably specified such that substantially constant values for the control parameters $K_P$ and $T_1$ are present in a lower range around values for the positive sequence voltage of 0%, with respect to the nominal value of the positive sequence voltage. The lower range can range for example from percentage values of 0 to 15%. Depending on the electrical power supply network, to which the wind turbine should supply power, the lower range can also be selected broader, e.g. from 0 to 30%, or narrower, e.g. from 0 to 5%. The curve progression between the lower range and the upper range can be specified depending on properties of the incoming power network. However, the correlation should at least be such that the functions are continuous over the entire definition range and fall or rise in a monotone manner over the entire relevant range. A smooth progression, i.e. a constant first deviation of the functions, is also preferably advantageous.

In an embodiment, the functions are specified depending on further network variables such as a network impedance, a network short-circuit current, frequency gradients or low-frequency voltage harmonics, which are taken into consideration as variables in the functions and which exist instead as input variables at the calculation blocks 76 and 78. In another embodiment, a plurality of characteristic curves and/or functions for determining the PLL parameters $K_P$ and $T_1$ are specified in the calculation blocks 76 and 78, from which suitable characteristic curves can be selected for determining the PLL parameters $K_P$ and $T_1$ depending on the control signals present at the blocks. For this, the plurality of characteristic curves and/or functions are each assigned to a corresponding control signal value for the pending input signals. The calculation blocks 76 and 78 can have a characteristic line selector for selecting the characteristic curves/functions, which is set up to select both a characteristic curve for determining the PLL parameter $K_P$ and a characteristic curve for determining the PLL parameter $T_1$ depending on the control signals and their signal values according to the assignment. The control signals are thereby preferably provided by a higher-level controller than the converter controller 46 (FIG. 2). For example, the wind turbine controller 48 (FIG. 2) or the wind farm controller 28 (FIG. 2) can be set up to provide corresponding control signals. The provision can thus be adjusted for example for the actual reactive power supply of the wind turbines or respectively of the wind farm and the actual error pattern or respectively the temporal progression of the voltage during the network error. The higher-level controller can thus adjust the behavior of the phase locked loop according to different phases of the network error, whereby a dynamic adjustment of the PLL parameters is possible over a broad range through the voltage dependency of the functions or respectively characteristic curves.

Figure 4:
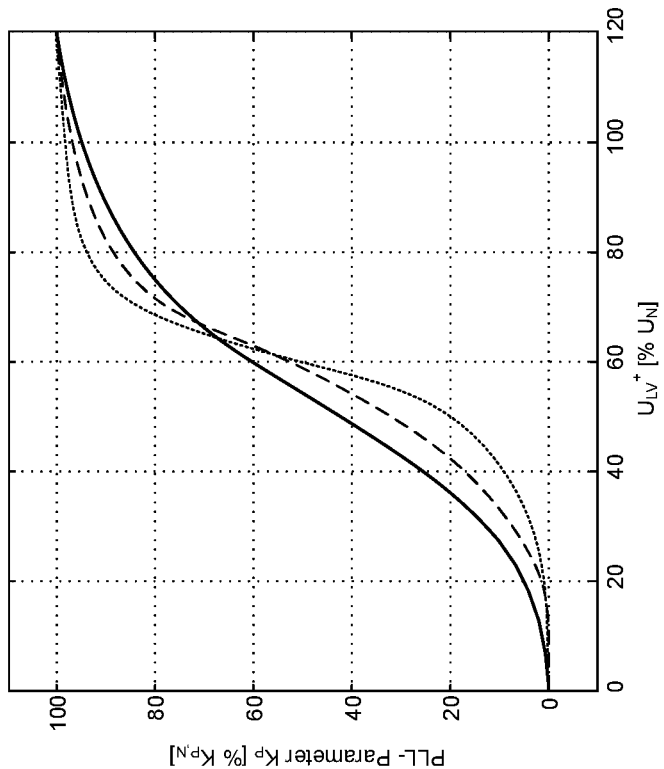
FIG. 4 illustrates two examples of a dependency of the PLL parameters on the positive sequence voltage.
Figure 4:
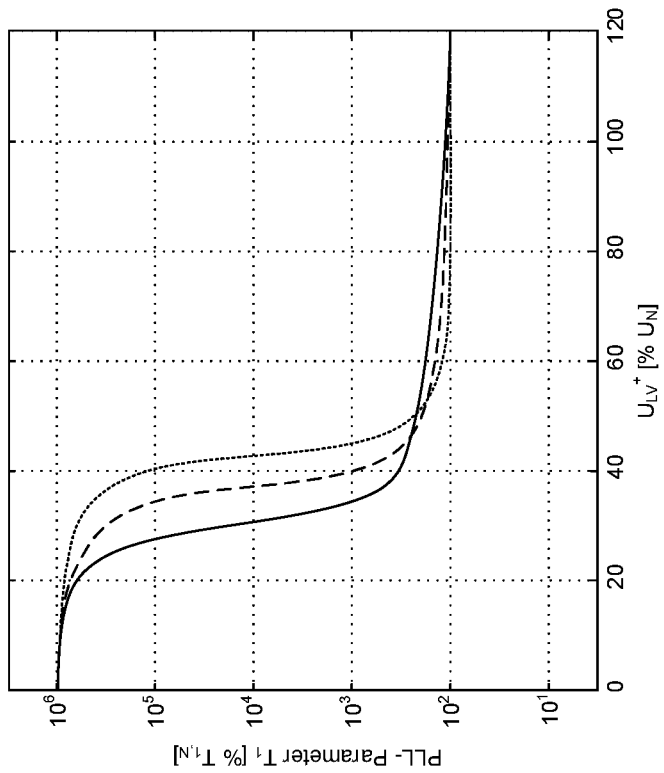

The left curve of FIG. 4 shows potential characteristic curve progressions for the PLL parameter $T_1$ of the $PT_1$ element 64 depending on the positive sequence voltage $U_{LV}+$, as they can be specified in the block 78, and the right curve shows potential characteristic curve progressions for the PLL parameter $K_P$ of the P element 62 depending on the positive sequence voltage $U_{LV}+$, as they can be specified in the block 76. The positive sequence voltage is thereby applied as a percentage value referring to its nominal value $U_N$. For the PLL parameter $T_1$, a percentage representation referring to a specified parameter $T_{1,N}$ was selected, which is scaled by means of a stored function. For the PLL parameter $K_P$, a percentage representation referring to a specified parameter $K_{P,N}$ is selected, which is also scaled by means of a stored function.

Referring to the left curve of FIG. 4, the PLL parameter $T_1$ of the $PT_1$ element 64 only has a slight slope and substantially constant, very high values in the range from 0 to 20% of the positive sequence voltage. For a positive sequence voltage from 100 to 120%, the parameter also only has a slight slope and substantially a constant value of approximately $T_{1,N}$. In a range of approximately 20 to 50% of the positive sequence voltage, the characteristic curves have a steep gradient. The solid characteristic curve changes the behavior of the $PT_1$ element only for deeper voltage errors than the dotted characteristic line.

Referring to the right curve of FIG. 4, the PLL parameter $K_P$ of the P element 62 also only shows a slight slope and a substantially constant value of approximately $K_P$ in the range from 0% to approximately 20% and from 100% to 120% of the positive sequence voltage. In a transition area between 20% and 100% of the positive sequence voltage, the characteristic curve progressions are selected such that they have an inflection point. The rise of the characteristic curves in the inflection point characterizes the behavior of the P element in the transition area. The progression of the curves is smooth and monotone. Depending on the network properties, the ranges with different rises can deviate in their width and in their course.

Figure 5:
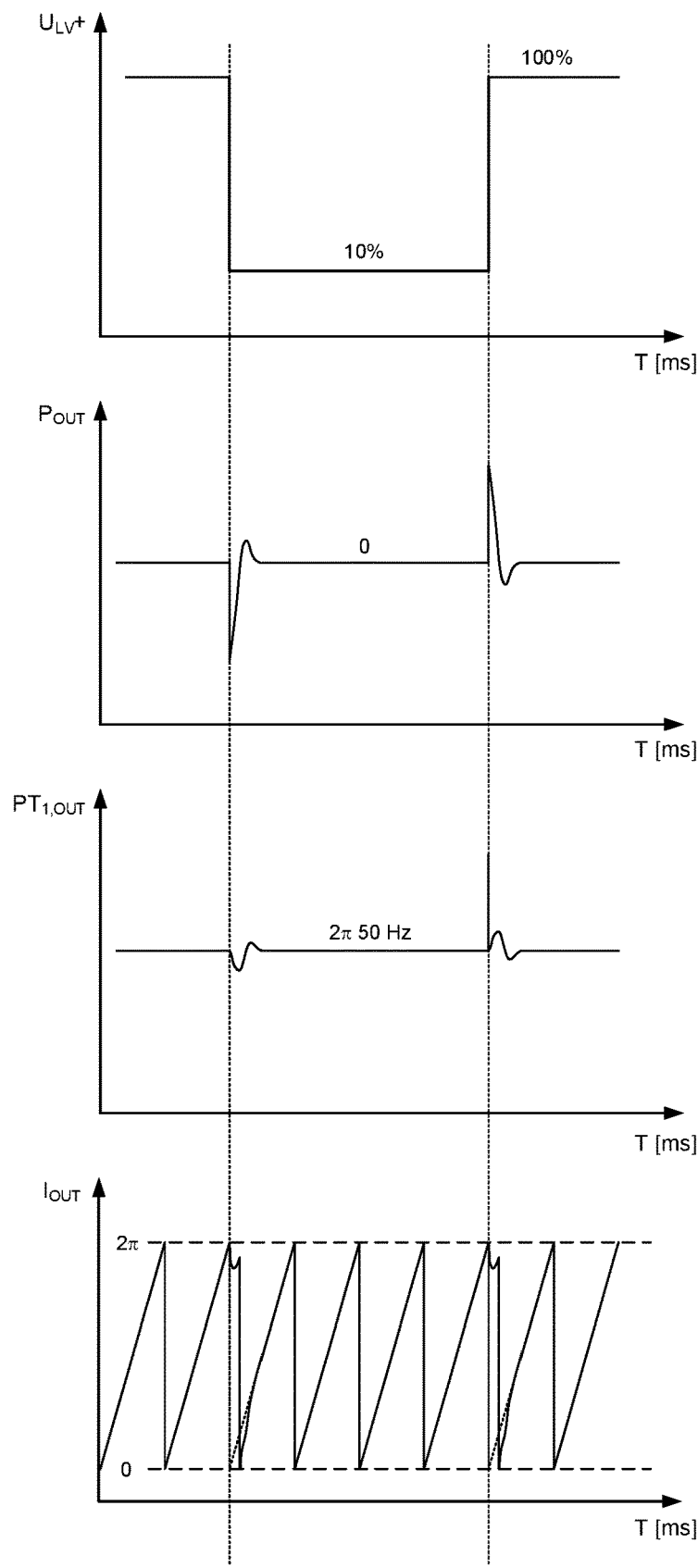
FIG. 5 illustrates an example of the temporal behavior of the PLL when there is a deep voltage error.

FIG. 5 shows the temporal behavior of the PLL 58 depending on the positive sequence voltage broken down to the PLL elements. The case in which the positive sequence voltage $U_{LV}$+ falls from a value with 100% of the nominal voltage $U_N$ for a period of time determined by the network error simulated here to a value of 10%. The positive sequence voltage of 10% then jumps back to the nominal value with 100%.

The proportional element 62 accesses the error variable from $\varphi_{Line}$ and $\varphi_{PLL}$. If the PLL is in a steady state before a drop in the positive sequence voltage, then the output variable of the P element 62 is zero. In the event of a voltage drop to 10%, the parameter $K_P$ is set to zero or a very small value. The output of the P element 62 $P_{OUT}$ thereby shows the progression shown as an example in FIG. 5, where a reduction in the P value with a slight overshoot results before the output variable 0 is output again. A similar temporal behavior shows the P element 62 during the return of the positive sequence voltage and its jump from 10% to 100%.

The output variable of the $PT_1$ element 64 $PT_{1,OUT}$ also shows a very similar progression where the voltage changes also result in slight overshoots.

The output variable of the integrator 74 $I_{OUT}$ is of particular interest here. It shows that the phase angle continues linearly with time during the voltage drop. Only the two phase jumps lead to a change in the phase in the subsequent cycle.

The above exemplary embodiment is based exclusively on an assessment of the voltage in the positive sequence system. An examination of the negative sequence system would also generally be possible. An array of curves would be saved in the controller for the negative sequence voltage, which determines a curve depending on a further variable, which takes into consideration the state of the power network. Thus, for example, a network impedance and/or the inductive or capacitive portion of the fed-in current or power could be taken into consideration. A rate of change of the peak or effective value of the network voltage could also be applied.

The invention claimed is:

1. A method for operating a wind turbine configured to supply electrical power to an electrical power supply network via a converter, the method comprising:
   measuring a phase angle and measuring a voltage of the electrical power supply network;
   determining a value of at least one parameter for a phase locked loop depending on the measured voltage;
   adjusting for a network error, wherein the network error comprises a voltage drop to a value of 15% of nominal value or less;
   using the phase locked loop to determine a corrected phase angle depending on the measured phase angle and the measured voltage of the electrical power supply network; and
   inputting the corrected phase angle into the converter.

2. The method according to claim 1, wherein the at least one parameter determines dynamics of the phase locked loop.

3. The method according to claim 2, wherein the at least one parameter is configured to slow the dynamics if the measured voltage is low.

4. The method according to claim 3, wherein the at least one parameter assumes a value such that the phase locked loop holds the corrected phase angle at an almost constant value if the measured voltage is below a threshold value.

5. The method according to claim 1, further comprising a proportional loop filter, wherein the at least one parameter is a proportionality constant $K_P$, and wherein a value of the proportionality constant is determined in a voltage-dependent manner.

6. The method according to claim 5, further comprising a low-pass filter, wherein the at least one parameter is a time constant $T_1$, and wherein a value of time constant is determined in a voltage-dependent manner.

7. The method according to claim 6, wherein dynamics of the phase locked loop are determined in a voltage-dependent manner by at least one of the proportionality constant Kp and the time constant $T_1$.

8. The method according to claim 6, wherein the proportionality constant $K_P$ assumes a value of almost zero when there is a network error.

9. The method according to claim 8, wherein the value of the time constant $T_1$ is considerably increased when there is a network error.

10. The method according to claim 6, further comprising a dead-time element having an adjustable dead time Tt.

11. The method according to claim 1, wherein the at least one parameter is specified as a continuous function depending on the voltage.

12. The method according to claim 11, wherein the value of the at least one parameter progresses in a voltage-dependent manner between a minimum value and a maximum value.

13. The method according to claim 1, wherein the voltage is a positive sequence voltage.

14. The method according to claim 1, wherein the voltage is a negative sequence voltage.

15. The method according to claim 1, wherein the corrected phase angle is determined in a continuous manner.

16. The method according to claim 1, further comprising setting the at least one parameter of the phase locked loop.

* * * * *